(12) United States Patent
Heeger et al.

(10) Patent No.: US 7,531,835 B2
(45) Date of Patent: May 12, 2009

(54) INCREASED MOBILITY FROM ORGANIC SEMICONDUCTING POLYMERS FIELD-EFFECT TRANSISTORS

(75) Inventors: Alan J. Heeger, Santa Barbara, CA (US); Daniel Moses, Santa Barbara, CA (US); Guangming Wang, Goleta, CA (US); James S. Swensen, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 416 days.

(21) Appl. No.: 11/284,797

(22) Filed: Nov. 21, 2005

(65) Prior Publication Data

US 2006/0128053 A1    Jun. 15, 2006

Related U.S. Application Data

(63) Continuation of application No. 10/320,933, filed on Dec. 16, 2002, now Pat. No. 7,078,261.

(51) Int. Cl.
*H01L 35/24*    (2006.01)
*H01L 51/00*    (2006.01)

(52) U.S. Cl. .............. 257/40; 257/642; 257/E21.024; 257/E39.007; 257/E51.046

(58) Field of Classification Search ............ 438/82, 438/99, 780, 781; 257/40, 642, E21.024, 257/E39.007, E51.046
See application file for complete search history.

(56) References Cited

U.S. PATENT DOCUMENTS

| | | | |
|---|---|---|---|
| 5,663,573 A * | 9/1997 | Epstein et al. | 257/40 |
| 6,852,555 B1 * | 2/2005 | Roman et al. | 438/22 |
| 6,992,322 B2 * | 1/2006 | Narayan | 257/40 |
| 2003/0085397 A1 * | 5/2003 | Geens et al. | 257/40 |

* cited by examiner

*Primary Examiner*—Michelle Estrada
(74) *Attorney, Agent, or Firm*—Berliner & Associates

(57) ABSTRACT

Organic FETs are produced having high mobilities in the accumulation mode and in the depletion mode. Significantly higher mobility is obtained from FETs in which RR-P3HT film is applied by dip-coating to a thickness of only about 20 Å to 1 μm. It was found that the structural order of the semiconducting polymer at the interface between the semiconducting polymer and the $SiO_2$ gate-insulator is important for achieving high carrier mobility. Heat-treatment under an inert atmosphere also was found to increase the on/off ratio of the FET.

5 Claims, 6 Drawing Sheets

INCREASED MOBILITY FROM ORGANIC SEMICONDUCTING POLYMERS FIELD-EFFECT TRANSISTORS

This Is a Continuation Patent Application of U.S. Patent application Ser. No. 10/320,933, filed Dec. 16, 2002 now U.S. Pat. No. 7,078,261, titled, "INCREASED MOBILITY FROM ORGANIC SEMICONDUCTING POLYMERS FIELD-EFFECT TRANSISTORS"by Alan J. Heeger et al, assigned to the assignee of the presently claimed subject matter.

BACKGROUND OF THE INVENTION

Description of the Related Art

Regioregular poly(3-hexylthiophene) (RR-P3HT) has received considerable attention in the literature as a semiconducting (conjugated) polymer with relatively high field effect mobility. Measurements of RR-P3HT field effect transistors (FETs) (SiO$_2$ as gate insulator) at room-temperature yielded mobilities of $\mu$=0.045 cm$^2$s$^{-1}$V$^{-1}$ (See reference 1) with "bottom-contact" structure, 0.1 cm$^2$s$^{-1}$V$^{-1}$ (See reference 2) with "top-contact" structure were reported. The higher mobility attributed to ordered microcrystalline polymer regions with a lamellar structure formed by self-organization.

The RR-P3HT films used for fabricating the FETs have been deposited by a variety methods with the goal of low cost manufacturing, including, drop casting (See reference 1); spin coating (See references 2-3); printing (See reference 4); and Langmuir-Blodgett (LB) film deposition (See reference 5).

The quality of the RR-P3HT FETs appears to be sensitive to the dynamic self-organization of the macromolecules as the polymer solution passes from the liquid phase to the solid-state phase. A number of external factors can affect the degree of order of the lamellar structure in the microcrystalline regions in the film. For example, RR-P3HT FETs fabricated by drop-casting exhibit higher field-effect mobility than those fabricated by spin-coating. (See reference 1). In the "bottom-contact" FET, the non-flat surface of the substrate (due to the pre-deposited source and drain electrodes) seems to inhibit the structural ordering of RR-P3HT chains during film formation, as evidenced from the observation of higher mobility in "top-contact" FETs (See reference 2).

The major barrier to progress is that most organic polymer FETs have relatively low field mobilities and/or are difficult to synthesize. Inexpensive methods like processing from solution previously yielded poorly ordered films, resulting in low mobilities.

REFERENCES

1. Z. Bao, A. Dodabalapur, and A. J. Lovinger, Appl. Phys. Lett., 69, 4108 (1996).
2. H. Sirringhaus, N. Tessler, R. H. Friend, Science, 280, 1741 (1998).
3. H. Sirringhaus, P. J. Brown, R. H. Friend, M. M. Nielsen, K. Bechgaard, B. M. W. Langeveld-Voss, A. J. H. Spiering, R. A. J. Janssen, E. W. Meijer, P. Herwig, and D. M. de Leeuw, Nature 401, 685 (1999).
4. Z. Bao, Y. Feng, A. Dodabalapur, V. R. Raju, and A. J. Lovinger, Chem. Mater. 9, 1299 (1997).
5. G. Xu, Z. Bao, and J. T. Groves, Langmuir, 16, 1834 (2000).
6. S. M. Sze, Physics of Semiconductor Devices, (Wiley, New York, 2nd Edition, 1981).
7. D. Moses, H. Okumoto, C. H. Lee, A. J. Heeger, T. Ohnishi, and T. Noguchi, Phys. Rev. B 54, 4748 (1996).
8. A. Dodabalapur, L. Torsi, H. E. Katz, Science, 268, 270 (1995).
9. T. W. Hagler, K. Pakbaz, K. F. Voss, and A. J. Heeger, Phys. Rev. 44, 8652(1991).

SUMMARY OF THE INVENTION

In one embodiment this invention provides a process for constructing organic field effect transistors. This process comprises the steps of: a) providing a substrate having a gate electrode; b) providing the substrate with source and drain electrodes; and c) providing upon the substrate directly from solution, a layer of organic semiconducting polymer. The fabricated transistor has a high mobility (higher than previously reported). The inventors found the high mobility, of about 0.2 cm$^2$ V$^{-1}$s$^{-1}$, correlated to an improved structural order of the organic semiconducting polymer layer and that the improved structural order was demonstrated by a strong absorption of the 0-0 absorption band, greater than about 86% of that of a maximum absorbance for regioregular poly 3-hexylthiophene optical spectrum. In another embodiment the organic semiconducting polymer is deposited upon the substrate by dip-coating in a layer of about 20 Å to 1 μm in thickness. In another embodiment, the thickness OF the organic semiconducting polymer is 20 to 40 Å in thickness.

In another embodiment, after layering the FET substrate with the organic semiconducting polymer, the FET substrate was heat-treated at about 160° C. for about three minutes in an inert atmosphere of nitrogen. The heat treatment increased the on/off ratio of the FET.

This invention provides FETs fabricated by any of these processes or a FET characterized in that the transistor has a high mobility correlating to an improved structural order of the polymer semiconducting layer, which order is demonstrated by optical spectrum. This invention also provides an integrated circuit comprising a field effect transistor obtained by any of these processes.

In a more specific embodiment, the FET devices employed a polythiophene polymer as the organic semiconducting polymer. In a yet a further embodiment, RR-P3HT was used as the polythiophene polymer. FET device fabrication is simplified because of the dip-coating of the polymer is from solution.

Thus, ultra-thin films of RR-P3HT formed by dip coating yielded higher mobilities and indicated improved structural order of the semiconducting polymer near the polymer-insulator interface. Films made using dip-coating exhibited field-effect mobilities up to about 0.2 cm$^2$s$^{-1}$V$^{-1}$ in field-effect transistors (FETs) with the "bottom-contact" structure. Although the mobility obtained with "top-contact" FETs is typically a factor of two higher than that of "bottom-contact" devices (See reference 3), the present invention was directed to study the polymer FETs with "bottom-contact" structures since deposition of the polymer is the final step in the device fabrication and bottom-contact structures arc preferred since it will reduce contamination of the semiconducting polymer film during the fabrication of polymer FETs in integrated electronic circuits.

Figure 2:
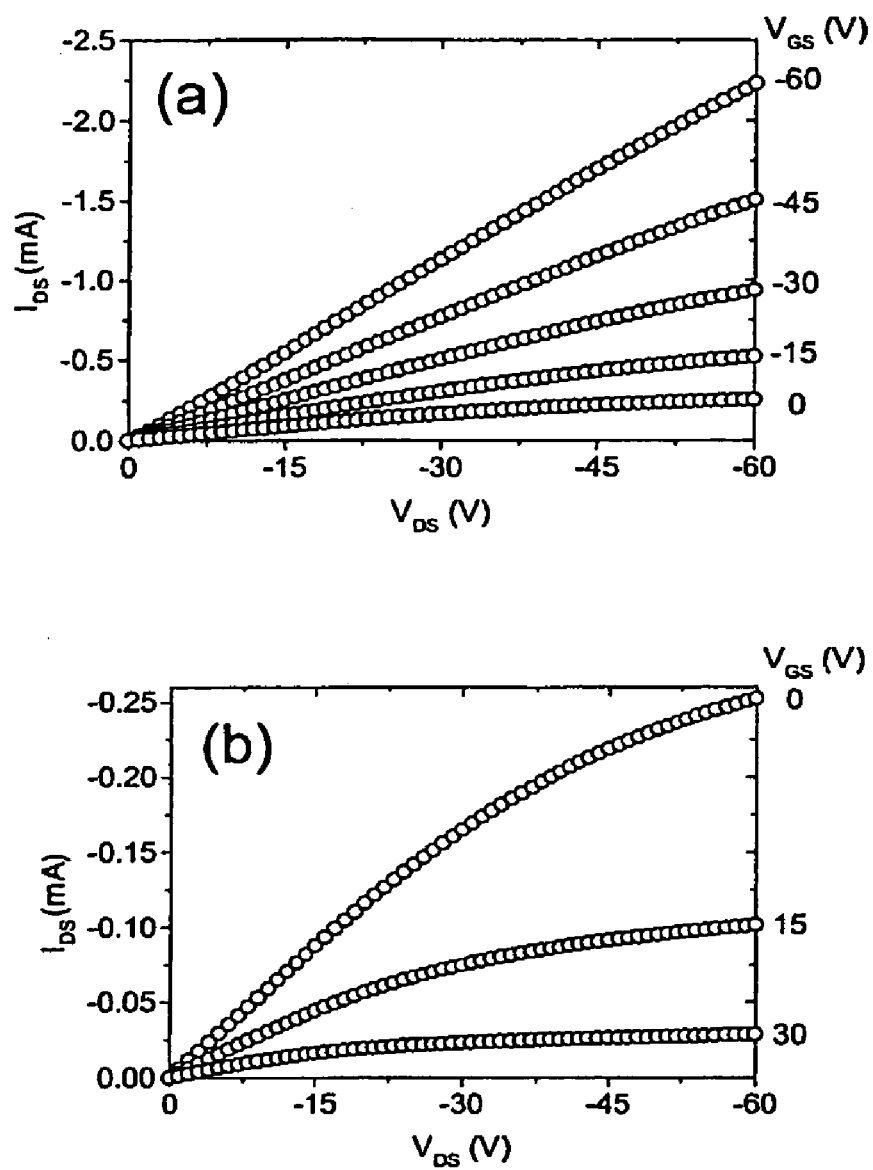
Figure 3:
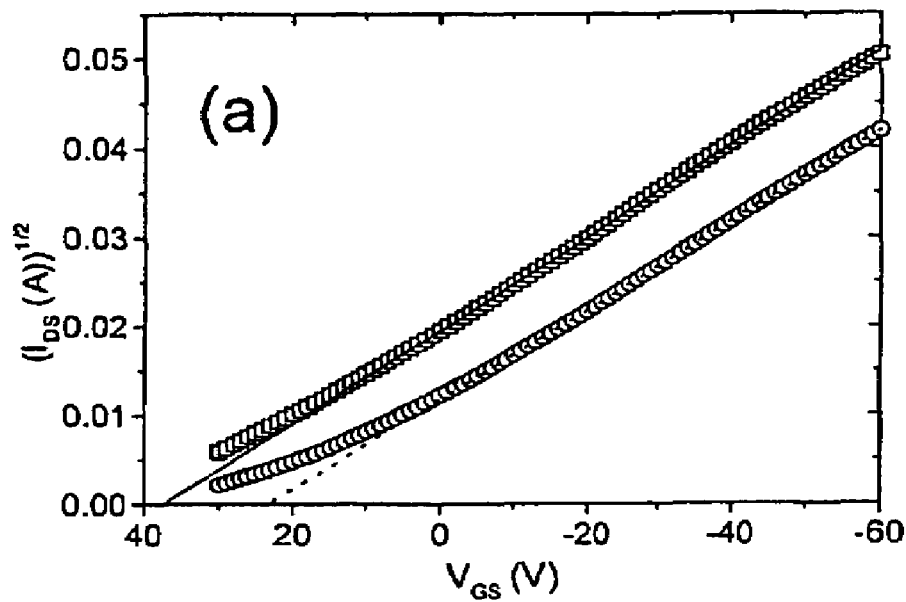
Figure 3:
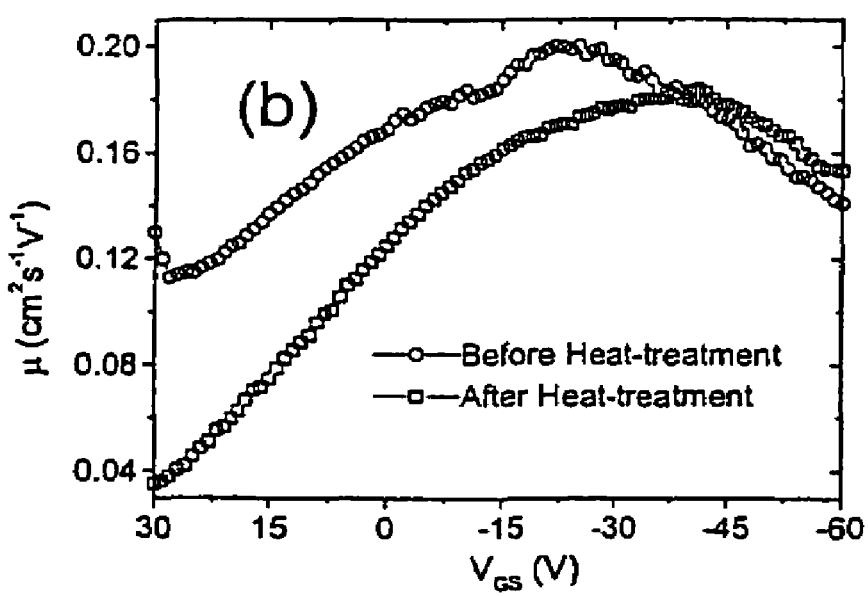
Figure 4:
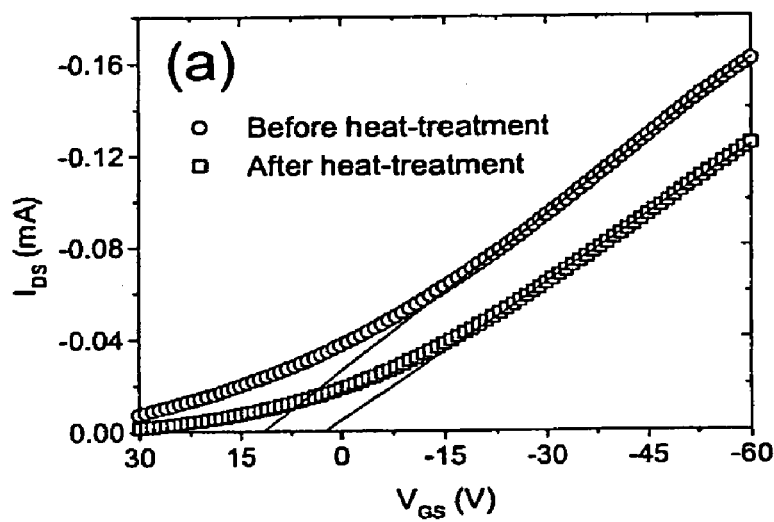
Figure 4:
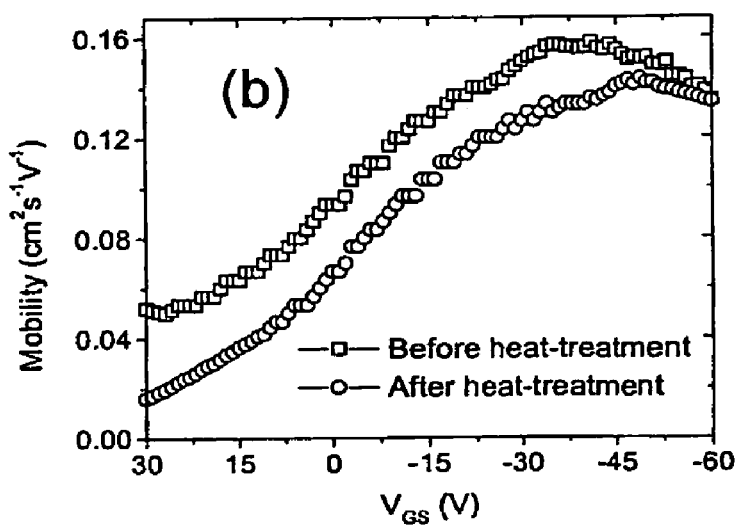
Figure 5:
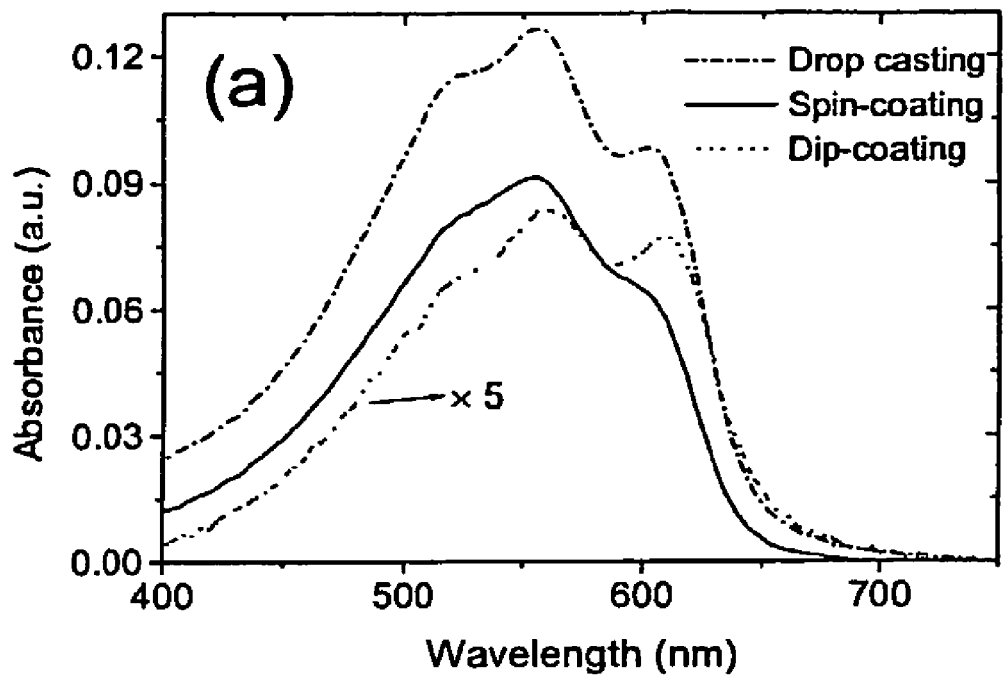
Figure 5:
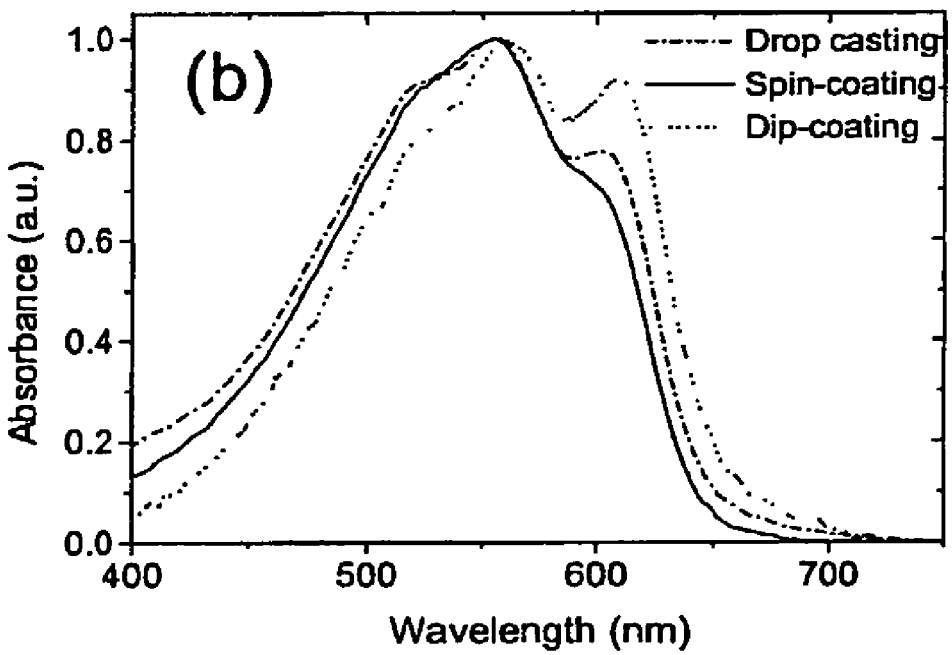
Figure 6:
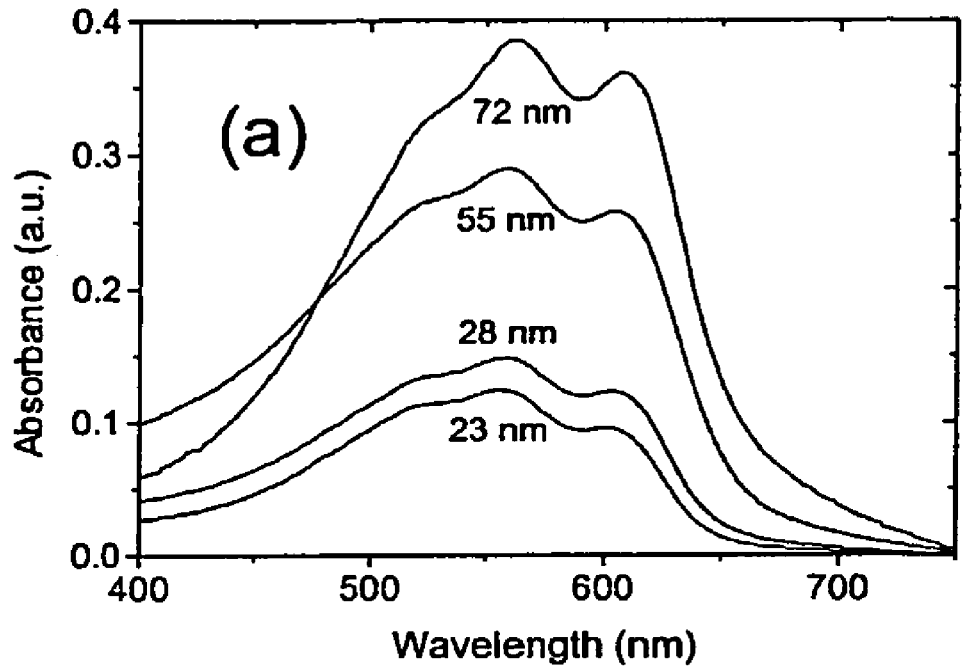
Figure 6:
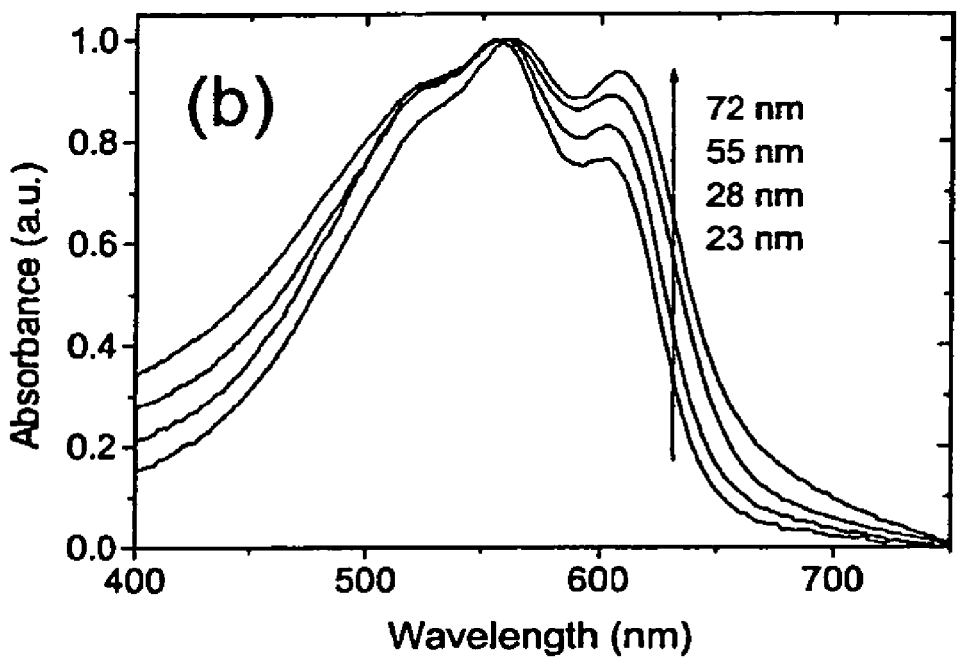

and in the depletion mode (FIG. 1b), the FET having a channel width W=1000 μm and channel length L=25 μm;

FIG. 2 shows the drain current vs. the voltage applied between source and drain electrodes for RR-P3HT at different gate voltages in the accumulation mode (FIG. 2a) and in the depletion mode (FIG. 2b), the FET having a channel width W=1000 μm and channel length L=5 μm;

FIG. 3 shows the drain current vs. gate voltage of a RR-P3HT FET, in saturation regime (a) $I_D^{1/2}$ vs. $V_G$ at $V_D$=-60V, and (b) field-effect mobility vs. gate voltage at $V_D$=-60V;

FIG. 4 (a) shows the drain current vs. gate voltage of a RR-P3HT FET before and after heat treatment at $V_D$=-5V, and (b) the field-effect mobility vs. gate voltage before and after heat treatment at $V_D$=-5V;

FIG. 5 shows optical absorption spectra (UV) without normalization (a), and with normalization (b) of RR-P3HT films deposited by dip-coating (dotted line), spin-coating (bold line) and drop casting (dashed and dotted line); and FIG. 6 shows optical absorption spectra (UV) without normalization (a), and with normalization (b) of the regioregular P3HT films with different thicknesses deposited by drop casting.

DETAILED DESCRIPTION OF THE INVENTION

The FET Substrate

The FET structures (with different source-drain separations) were fabricated on an n-doped Si wafer; the n-doped Si was used as the gate. The gate dielectric was about a 200 nm film of $SiO_2$ thermally grown directly on the wafer. The FET structure was fabricated with Au source and drain electrodes which were deposited on the $SiO_2$ by E-beam evaporation. The use of other metals for the source and drain electrodes are known and could be substituted for the gold; see C-T Kuo and W-H Chiou, Synthetic Metals, v. 88, p. 23-30 (1997).

The channel lengths (source-drain separation) ranged between about 5-25 μm, and the channel width was about 1000 μm. The "bottom-contact" FET structures were treated in hexamethyldisilazane before deposition of the RR-P3HT (See reference 2). Electrical measurements were made while the FETs were in a nitrogen environment using a Hewlett-Packard 4155B semiconductor parameter analyzer.

The organic polymer used in the present invention was regioregular poly(3-hexylthiophene) (RR-P3HT). The results obtained by the following examples of the present invention are characteristic of the class of semiconducting polymers, including, for example poly (phenylene vinylene) and its soluble derivatives; a range of oligo- and/or polythiophene compounds, such as regioregular poly(3-hexylthiophene) (RR-P3HT), a,w-dihexyl-sexithiophene (α, ωDH6T), and fluorine-bithiophene (F8T2), and other organic polymers, such as polythienylenevinylene (PTV).

In one embodiment, RR-P3HT (with head-to-tail linkages greater than about 98.5%) and a high purity solvent, e.g. chloroform, (anhydrous with purity >99%), used in the present invention were obtained from the Aldrich Chemical Company. The solutions of RR-P3HT in chloroform were made with weight concentration of about 1.0 mg/ml, and filtered through a 0.20 μm pore size polytetrafluoroethylene (PTFE) membrane syringe filter.

EXAMPLES OF THE INVENTION

This invention will be further described by the following examples. These are intended to embody the invention but not limit its scope. Comparable utilities and advantages can be realized using various other embodiments consistent with this invention.

Example 1

An organic FET was fabricated by spin coating. The RR-P3HT polymer film was deposited from solution at a spin rate of 2000 rpm. The concentration of the polymer solution was about 1.0 mg/ml. The resulting film thickness was about 20 nm.

Example 2

An organic FET was fabricated by drop-casting. The resulting film thickness was about 55 nm, although drop-cast films are typically non-uniform in thickness.

Example 3

An organic FET was fabricated by dip-coating. The FET substrate was dipped into the RR-P3HT polymer solution and carefully removed at a speed of about 0.2 to about 0.5 mm/s. The performance of organic FETs made by the three methods in Examples 1-3 were then compared.

Figure 1:
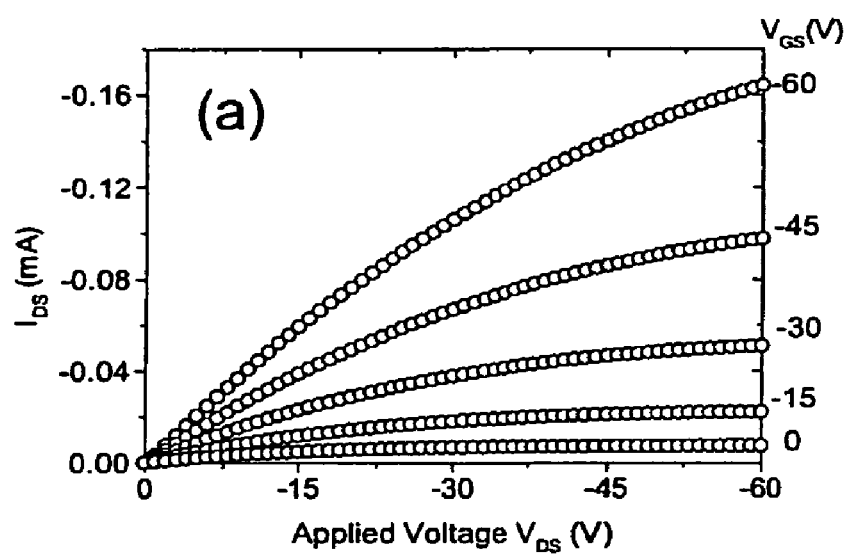
FIG. 1 shows the drain current vs. the voltage applied between source and drain electrodes of a RR-P3HT FET, at different gate voltages in the accumulation mode (FIG. 1a)
Figure 1:
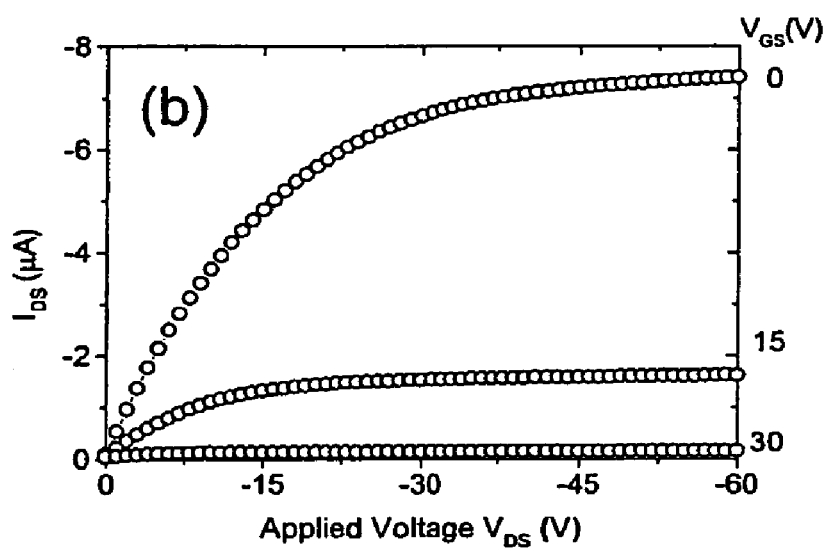

The mobilities obtained from FETs fabricated using spin-coating (Example 1) and, drop casting (Example 2) were similar to the values obtained by Bao, et al (μ<0.05 $cm^2V^{-1}s^{-1}$) (See reference 1). FIG. 1 shows a typical drain current ($I_{DS}$) vs. source-drain voltage ($V_{DS}$) plot at various gate voltages in both accumulation (FIG. 1(a)) and depletion (FIG. 1(b)) modes for a RR-P3HT FET fabricated by dip-coating, where the channel width W=1000 μm and channel length L=25 μm. The capacitance per unit area ($C_i$) for the 200 nm $SiO_2$ insulating layer was $C_i$=15 $nF/cm^2$ (See reference 6). Equation 1 uses the relationship between the drain current and the gate voltage $V_{GS}$ in the FET saturation regime.

$$I_{DS} = \frac{WC_i}{2L}\mu(V_{GS} - V_T)^2, \quad (1)$$

The field-effect mobility (μ) and the threshold voltage ($V_T$) found from the data were about 0.11 $cm^2s^{-1}V^{-1}$ and 13 V, respectively. The on/off ratio for this device (see FIG. 1) was $10^3$. in the range of about 150° C.-170° C. for about 3 minutes in an inert $N_2$ gas environment, the mobility decreased slightly (to about 0.11 $cm^2s^{-1}V^{-1}$), and the on/off ratio increased to about $6\times10^3$. Any inert gas can be used, such as argon. The purpose of the heat treatment was to remove any volatile impurities. The observed increase in the on/off ratio indicated fewer carriers (higher purity) after heat treatment.

Example 4

FIG. 2 shows drain current IDS vs. source-drain voltage $V_{DS}$ plots at various gate voltages in both accumulation and depletion modes, where the channel width (W) was about 1000 μm and the channel length (L) was about 5 μm. Using Equation 1, the mobility μ=about 0.18 $cm^2s^{-1}V^{-1}$ about 37 V (see FIG. 3(a)) at $V_D$=-60V. The mobilities, on/off ratio, threshold voltages of RR-P3HT FETs deposited by dip-coating with different channel lengths in saturation regime.mobility, are summarized in Table 1 below. The maximum source-drain current used in FIG. 2 was close to, but slightly less than required for the saturation, in order to prevent device deterioration. Thus, the magnitude of mobility obtained from Equation 1 underestimated the actual device mobility.

TABLE 1

| Channel Length (μm) | Average Mobility ($cm^2s^{-1}V^{-1}$) | | Maximum Mobility ($cm^2s^{-1}V^{-1}$) | | Threshold Voltage (V) | | On/Off Ratio | |
|---|---|---|---|---|---|---|---|---|
| | Before heat treatment | After heat treatment | Before heat treatment | After heat treatment | Before heat treatment | After heat treatment | Before heat treatment | After heat treatment |
| 5 | 0.18 | 0.167 | 0.2 | 0.16 | 37 | 23 | 80 | $4 \times 10^2$ |
| 10 | 0.135 | 0.105 | 0.15 | 0.12 | 20 | 13 | $3 \times 10^2$ | $3 \times 10^3$ |
| 25 | 0.11 | 0.095 | 0.13 | 0.11 | 13.2 | 8 | $10^3$ | $6 \times 10^4$ |

The data in Table 1 were obtained from dip-coated samples. The film thicknesses were determined by ellipsometric spectroscopy and found to range between about 20 to 40 Å for different samples. All samples were fabricated from the same batch of polymer. Using the capacitance given above, 15 nF/cm², the injected charge density at $V_{GS}$=−60 V is $5.6 \times 10^{12}$/cm². If the injected charges were confined to a thickness of about 20 Å, the hole charge density was estimated to be about $3 \times 10^{19}$ cm⁻³ at $V_{GS}$=−60 V. Then, from the ratio of the source-drain current at $V_{GS}$=−60 V and $V_{GS}$=0,the hole density was about $3 \times 10^{18}$ cm⁻³ at $V_{GS}$=0. Since the latter value results from residual impurities (dopant ions), the RR-P3HT used in the examples contained a relatively high density of electronically active impurities. After heat-treatment, the threshold voltage decreased from about 37V to 23V, and the hole density decreased to about $1.5 \times 10^{18}$ at $V_{GS}$=0, indicating that heat treatment can partially de-dope the polymer and thereby improve the purity of the semiconducting polymer layer.

The mobility and the on/off ratio for the RR-P3HT FET decreased when the channel length was increased (see Table 1). This might arise from poor uniformity of the film over longer distances. Additionally, the rise of the mobility at higher $V_{DS}$ may arise from the field dependent mobility (See reference 7).

$I_{DS}$ is plotted vs. $V_{GS}$ in FIG. 3(a). From the slope (see Eq. 1), the average mobility is μ=about 0.18 cm²/Vs. FIG. 3(b) shows the relationship between field-effect mobility vs. gate voltage, as obtained from analysis of $\partial(I_D^{1/2})/\partial(V_{GS})$ (see Eq. 1). A maximum mobility of μ=about 0.2 cm²s⁻¹V⁻¹ was obtained before heat treatment and a maximum mobility of μ=about 0.18 cm²s⁻¹V⁻¹ was obtained after heat treatment, at $V_{DS}$=−60V. These are high mobility values reported for RR-P3HT FETs.

The mobility dependence on the gate voltage shown in FIGS. 3(b) and 4(b) indicated that the mobility initially increased with $V_{GS}$, reached a maximum at slightly higher fields, beyond which it decreased. The initial increase of the mobility may stem from screening of the charged defects as the carrier concentration was increased at higher $V_{GS}$, which in effect reduced the effective trap concentration in the polymer film.

In the linear regime, the following equation is appropriate; see FIG. 4(a).

$$I_{DS} = \frac{WC_i}{L}\mu\left(V_{GS} - V_T - \frac{V_{DS}}{2}\right)V_{DS} \quad (2)$$

Using Equation 2 and the $I_{DS}$ vs. $V_{GS}$ data at $V_{DS}$=−5 V (channel length 5 μm), the mobility μ=about 0.15 and μ=about 0.13 cm²s⁻¹V⁻¹ before and after heat treatment, respectively. The mobility as a function of the gate-source voltage, obtained using Equation 2 and $\partial(I_{DS})/\partial(V_{GS})$, is shown in FIG. 4(b), both before and after heat treatment. The maximum mobility, $\mu_{max}$=0.16 cm²s⁻¹V⁻¹, was slightly lower than that obtained in the saturation regime. Since this value was obtained at lower $V_{DS}$, the lower value might arise from the well-known field dependence of the mobility of semiconducting polymers (See reference 7).

In FETs, the field induced charges are two-dimensional in nature and confined to a few monolayers located at the polymer-insulator interface (See reference 8). Thus, the degree of order of macromolecules near the polymer-insulator interface is of obvious importance for obtaining high mobility and thereby good polymer FET performance. Therefore, the relatively high carrier mobility obtained from thin polymer FET made by dip-coating originates from the improved structural order of the semiconducting macromolecules near the polymer-insulator interface. This order is improved over that achieved in FETs fabricated by other methods such as drop-casting and spin-coating techniques.

Supporting evidence of the improved structural order can be found based on the comparison of the UV absorption spectra obtained from thin films of RR-P3HT with different thicknesses fabricated by dip-coating, drop-casting, and spin-coating. As seen in FIG. 5, the spectrum of the dip-coated film had lower onset energy for the optical absorption, and better resolved vibronic structure, compared to the spectra of the polymer films made by spin-coating and drop-casting. These features indicate a higher degree of chain extension and chain alignment, as was demonstrated by Hagler et al. (See reference 9). FIG. 5(b) also indicated that, the structural order in the drop-cast film was better than that in the spin-cast film.

FIGS. 5a and 5b show a 0-0 absorption band peaked at 608 nm with high intensity. A strong (greater than 86% of that of the maximum absorbance) 0-0 absorption band indicated a highly ordered structure of P3HT as shown, for example, by reference 9. FIG. 5 shows optical absorption spectra (UV-visible) of RR-P3HT films deposited by dip-coating (dotted line), spin-coating (bold line) and drop casting (dashed and dotted line). The data are presented in FIG. 5(a) without normalization, and in FIG. 5(b) with normalization.

The enhanced chain extension and chain alignment in the thin dip-coated film most likely arose from the interaction of the polymer chains with the substrate. In particular, for a dip-coated polymer film that contained only two to three monolayers, the macromolecules at the semiconductor-insulator interface self-organized with a higher degree of structural order.

The mobility obtained from drop-cast films is higher than that obtained from spin-cast film, possibly because of the slower rate of evaporation of the solvent which facilitated slower film growth and thus a higher degree of order (See reference 1). The self-organization took place as the film passed from the solution phase to the solid phase. As the solvent evaporated from the surface of the polymer solution following drop-casting, film formation proceeded inward from the outer rapidly drying shell, thus resulting in improved order relative to that achieved using a spin-coating. Also, thicker drop-cast films exhibit higher degree of structural order at the FET channel region, as the molecules can self organize for a longer time at the inner core polymer solution. The improved structural order was manifested by the higher mobility, as well as the absorption spectra measured at various film thickness, as shown in FIG. 6.

In the spin-cast films, the self-organization was inhibited by the rapid drying and by the radial velocity of the polymer solution during drying. Indeed, as seen in FIG. 5(b), the 610 nm peak nearly disappeared in the absorption spectrum of the spin-cast film, and the onset of the absorption shifted to higher photon energy, signatures that indicated inferior structural order.

Thus, examples of field-effect mobilities from RR-P3HT FET of about 0.2 cm $s^{-1}V^{-1}$ have been demonstrated using "bottom contact" FET structures. Moreover, by comparing the performance of FETs, in which the semiconducting polymer film is deposited by different techniques, it has been found that dip-coating of ultra-thin films, comprising only about 2 to 3 monolayers of the RR-P3HT macromolecules, yielded higher mobilities than those deposited by drop-casting and spin-casting. Optical absorption data provided evidence that self organization in ultra-thin RR-P3HT film resulted in improved structural order near the polymer-insulator interface. Thus, the development of methods for depositing semiconducting polymer films with a high degree of inter-chain structural order can be expected to yield significantly higher mobilities.

These and other changes and modifications are intended to be included within the scope of the invention. While for the sake of clarity and ease of description, several specific embodiments of the invention have been described; the scope of the invention is intended to be measured by the claims as set forth below. The description is not intended to be exhaustive or to limit the invention to the form disclosed. Other variations of the invention will be apparent in light of the disclosure and practice of the invention to one of ordinary skill in the art to which the invention applies.

The invention claimed is:

1. A field effect transistor, comprising:
   a first electrode layer including a source and drain electrode;
   a regioregular, head-to-tail poly 3-hexylthiophene semiconducting polymer layer;
   an insulating layer; and
   a second electrode layer including a gate electrode,
   wherein the semiconducting polymer layer has an absorbance of a 0-0 absorption band in an optical spectrum.

2. The field effect transistor of claim 1 wherein the semiconducting layer has a thickness of about 20 Å to 1 μm.

3. The field effect transistor of claim 1, wherein the transistor has a mobility of about 0.2 $cm^2V^{-1}s^{-1}$.

4. The field effect transistor of claim 1, wherein the 0-0 absorption band is greater than about 86% of that of a maximum absorbance for regioregular poly 3- hexyltbiophene.

5. An integrated circuit comprising a field effect transistor obtained by a method as claimed in claim 1.

* * * * *